(12) United States Patent
Alameh et al.

(10) Patent No.: US 9,401,984 B1
(45) Date of Patent: Jul. 26, 2016

(54) METHOD AND APPARATUS FOR PREVENTING MISDIALS AND UNINTENDED ACTIVATION OF A PORTABLE WIRELESS COMMUNICATION DEVICE

(71) Applicant: Motorola Mobility LLC, Chicago, IL (US)

(72) Inventors: Rachid M Alameh, Crystal Lake, IL (US); David P Winkler, Palatine, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 14/613,445

(22) Filed: Feb. 4, 2015

(51) Int. Cl.
*H04M 1/72* (2006.01)
*H04M 1/725* (2006.01)
*G06F 3/041* (2006.01)
*G06F 3/0482* (2013.01)

(52) U.S. Cl.
CPC ........... *H04M 1/72577* (2013.01); *G06F 3/041* (2013.01); *G06F 3/0482* (2013.01); *H04M 1/72583* (2013.01)

(58) Field of Classification Search
CPC ..... G06F 3/0416; G06F 3/0488; G06F 3/017; G06F 2203/04808; G06F 3/041; H04M 2250/12; H04M 1/66; H04M 1/72577
See application file for complete search history.

(56) References Cited

U.S. PATENT DOCUMENTS

| | | | |
|---|---|---|---|
| 8,554,268 B2 | 10/2013 | Guo et al. | |
| 2010/0127995 A1* | 5/2010 | Rigazio | G06F 3/04886 345/173 |
| 2013/0307769 A1* | 11/2013 | Sharma | G06F 1/3215 345/156 |
| 2014/0120891 A1 | 5/2014 | Chen et al. | |

FOREIGN PATENT DOCUMENTS

WO 2014152080 A1 9/2014

* cited by examiner

*Primary Examiner* — Curtis Odom (57) ABSTRACT

A method and apparatus operate a user portable wireless communication device on a wireless wide area network. The user portable wireless communication device can include a first side and a user input located on the first side, where the user input can include a user actuation input. The device can include a second side orthogonal to the first side and a side touch sensor on the second side. The device can also include a controller coupled to the user input and the side touch sensor. The controller can be configured to detect whether a user is touching the side touch sensor, configured to enable the user actuation input when the user is touching the side touch sensor, and configured to disable the user actuation input of the user input when the user is not touching the side touch sensor.

20 Claims, 6 Drawing Sheets

METHOD AND APPARATUS FOR PREVENTING MISDIALS AND UNINTENDED ACTIVATION OF A PORTABLE WIRELESS COMMUNICATION DEVICE

BACKGROUND

1. Field

The present disclosure is directed to a method and apparatus for preventing misdials and unintended activation of a portable wireless communication device. More particularly, the present disclosure is directed to preventing misdials and unintended activation of a portable wireless communication device if a user is not touching a sensor on the side of the portable wireless communication device.

2. Introduction

Presently, portable wireless communication devices communicate with other communication device using wireless signals. Because such wireless communication devices are portable, users carry these devices in their pockets and purses. This means such devices can move around and press up against objects in a pocket or purse. Unfortunately, such movement causes a device to unintentionally make phone calls, send text messages, and otherwise unintentionally activate features of the device. Such unintentional phone calls are often called "pocket dials" or "purse dials," which annoys parties that are called and wastes users' talk minutes and data usage.

Thus, there is a need for a method and apparatus for preventing misdials and unintended activation of a portable wireless communication device.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore to be considered to be limiting of its scope.

DETAILED DESCRIPTION

Embodiments provide a method and apparatus for operating a user portable wireless communication device on a wireless wide area network. According to a possible embodiment, the user portable wireless communication device can include a first side and a user input located on the first side, where the user input can include a user actuation input. The device can include a second side orthogonal to the first side and a side touch sensor on the second side. The device can also include a controller coupled to the user input and the side touch sensor. The controller can be configured to detect whether a user is touching the side touch sensor, configured to enable the user actuation input when the user is touching the side touch sensor, and configured to disable the user actuation input of the user input when the user is not touching the side touch sensor.

Figure 1:
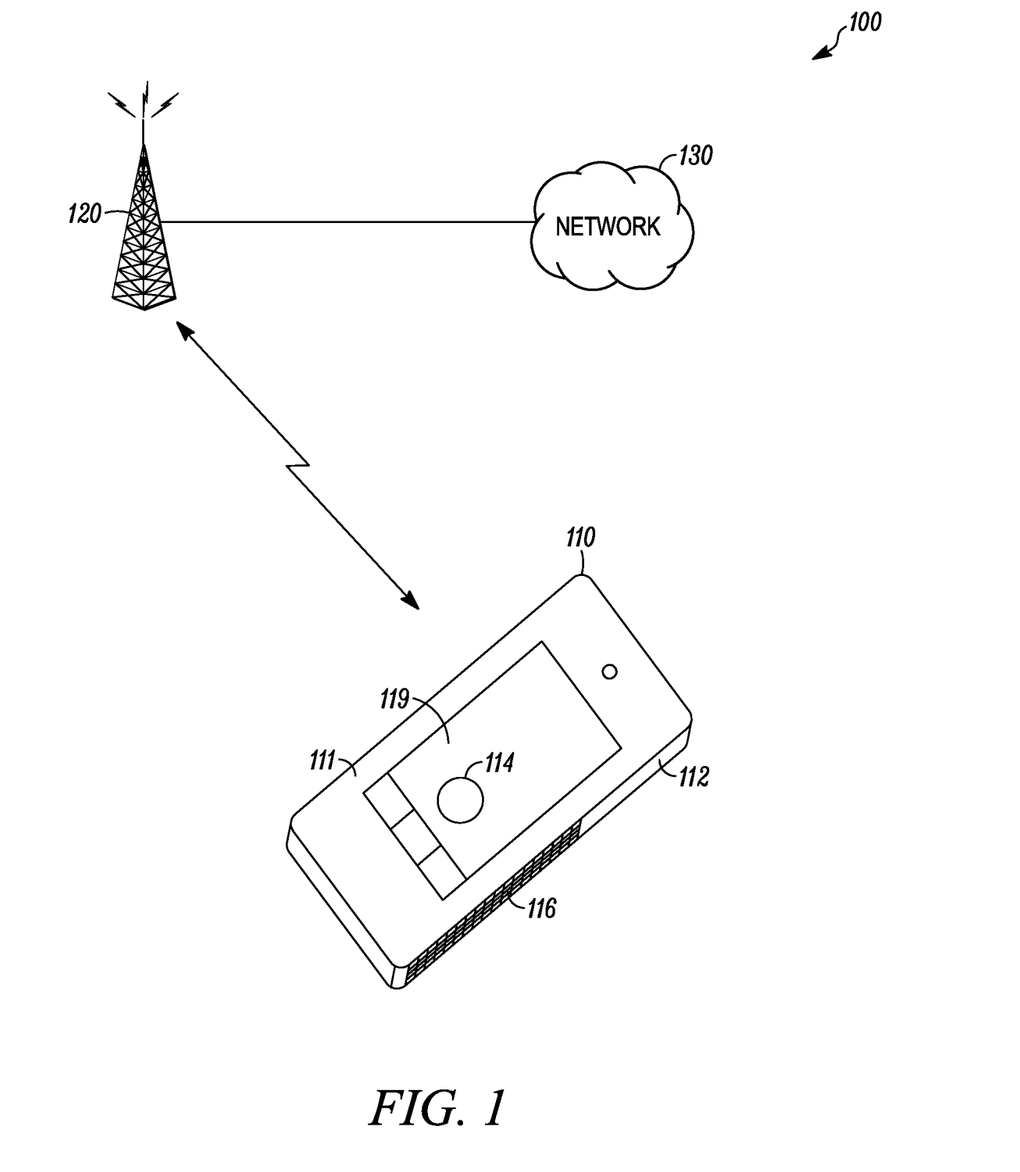
FIG. 1 is an example block diagram of a system according to a possible embodiment.

FIG. 1 is an example block diagram of a system 100 according to a possible embodiment. The system 100 can include a user portable wireless communication device, otherwise known as a user device 110 for brevity, a base station 120, and a network 130. The user device 110 can be any device that can operate on the network 130, such as a wireless communication network. For example, the user device 110 can be any cellular communication device, any Wi-Fi communication device, any Bluetooth® communication device, any wireless local area network communication device, any wireless wide area network communication device, or any other wireless communication device that a user can carry in the user's pocket or purse. According to a possible embodiment, the user device 110 can be a cellular phone, a smartphone, a selective call receiver, a candy bar phone, or any other cellular communication device that a user can carry in the user's hand, pocket, and/or purse.

The user device 110 can include a first side 111 and a user input 119 located on the first side 111. For example, the first side 111 can include a display and/or touch screen and the user input 119 and can also be considered a front side or touch screen side. The user input 119 can include a user actuation input 114. The first side 111 can also include physical buttons as the user input 119 including the user actuation input 114.

The user device 110 can also include a second side 112 orthogonal to the first side 111. The second side 112 can be considered an edge side between a front side, such as the first side 111, and a back side and can be generally shorter in one planar direction than the first side 111. The second side 112 may be straight or may be curved while still being orthogonal to the first side 111. For example, the first side 111 can be considered a front side and the user device 110 can have a third side (not shown) that can be considered a back side on an opposite side of the user device 110 from the front side. Then, the second side 112 can be orthogonal to both the front and the back side in that it can be a curved transition side between the front and the back side.

The second side 112 can include a side touch sensor 116. The side touch sensor 116 on the second side 112 can cover all or a portion of the second side 112. For example, one or more side touch sensors can cover 100%, at least 75%, at least 50%, at least 33%, or any other percentage of the second side 112 of the user device 110. The side touch sensor 116 can also wrap around to other sides orthogonal and/or parallel to the first side 111. Multiple side touch sensors can be employed to cover some or all sides of the user device 110 that a user typically touches when activating the user actuation input 114. For example, two side touch sensors can cover sides opposite and parallel to each other along with an additional side touch sensor that is orthogonal to the sides covered by the two side touch sensors.

The user device 110 can send and receive wireless communication signals over the network 130 via the base station 120 or via any other wireless access point. The network 130 can include any type of network that is capable of sending and receiving wireless network communication signals. For example, the network 130 can include a wireless communication network, a cellular telephone network, a Time Division Multiple Access (TDMA)-based network, a Code Division Multiple Access (CDMA)-based network, an Orthogonal Frequency Division Multiple Access (OFDMA)-based network, a Long Term Evolution (LTE) network, a 3rd Generation Partnership Project (3GPP)-based network, a Wireless Local Area Network (WLAN), a satellite communications network, and/or other wireless communications networks.

Figure 2:
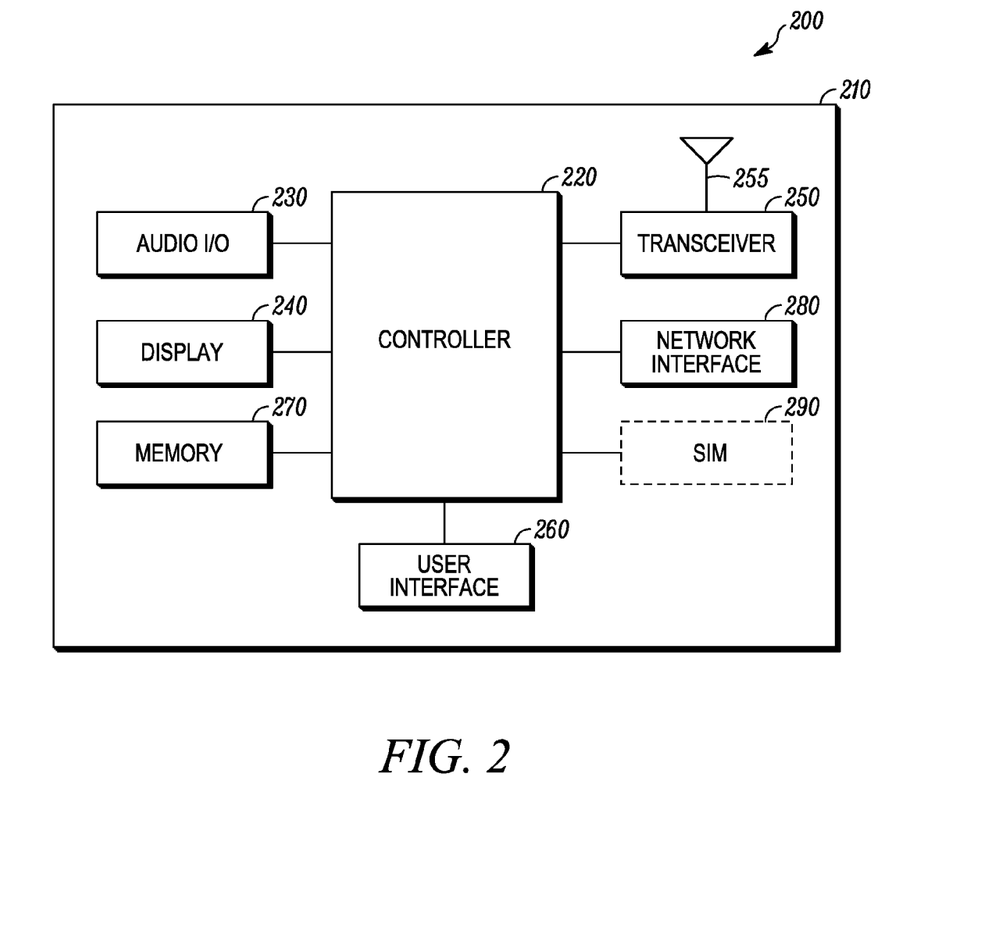
FIG. 2 is an example block diagram of an apparatus according to a possible embodiment.

FIG. 2 is an example block diagram of an apparatus 200, such as the user device 110, according to a possible embodiment. The apparatus 200 can include a housing 210, a controller 220 within the housing 210, audio input and output circuitry 230 coupled to the controller 220, a display 240 coupled to the controller 220, a transceiver 250 coupled to the controller 220, an antenna 255 coupled to the transceiver 250, a user interface 260 coupled to the controller 220, a memory 270 coupled to the controller 220, a network interface 280 coupled to the controller 220, and at least one side touch sensor 290 coupled to the controller 220.

The side touch sensor 290 can be a capacitive side touch sensor, a heat/thermal sensor, a mechanical popple type-sensor, a thermal sensor, a Radio Frequency (RF) detune sensor, a resistive sensor, and/or any other sensor that can detect a user's touch. The side touch sensor 290 can also be a vibration type sensor where an accelerometer-type sensor can be incorporated internal to apparatus 200 that can tell which side is touched by assessing vibration profile, or can be any other sensor useful for determining if a user is touching a side of a portable communication device to enable a user actuation input.

The display 240 can be a viewfinder, a liquid crystal display (LCD), a light emitting diode (LED) display, a projection display, a touch screen, or any other device that displays information. In operation as a touch screen, the display 240 can be the user interface 119 and can include the user actuation input 114.

The transceiver 250 can include a transmitter and/or a receiver. The audio input and output circuitry 230 can include a microphone, a speaker, a transducer, or any other audio input and output circuitry. The user interface 260 can also be the user interface 119, which can include the user actuation input 114 as part of a keypad, a keyboard, buttons, a touch pad, a joystick, a touch screen display, another additional display. The user interface 260 can also be other device useful for providing an interface between a user and an electronic device. The network interface 280 can be a universal serial bus port, an Ethernet port, an infrared transmitter/receiver, a USB port, an IEEE 1392 port, a WLAN transceiver, or any other interface that can connect an apparatus to a network or computer and that can transmit and receive data communication signals. The memory 270 can include a random access memory, a read only memory, an optical memory, a flash memory, a removable memory, a hard drive, a cache, or any other memory that can be coupled to a wireless communication device.

The apparatus 200 and/or the controller 220 may implement any operating system, such as Microsoft Windows®, UNIX®, or LINUX®, Android™, or any other operating system. Apparatus operation software may be written in any programming language, such as C, C++, Java or Visual Basic, for example. Apparatus software may also run on an application framework, such as, for example, a Java® framework, a .NET® framework, or any other application framework. The software and/or the operating system may be stored in the memory 270 or elsewhere on the apparatus 200. The apparatus 200 and/or the controller 220 may also use hardware to implement disclosed operations. For example, the controller 220 may be any programmable processor. Disclosed embodiments may also be implemented on a general-purpose or a special purpose computer, a programmed microprocessor or microprocessor, peripheral integrated circuit elements, an application-specific integrated circuit or other integrated circuits, hardware/electronic logic circuits, such as a discrete element circuit, a programmable logic device, such as a programmable logic array, field programmable gate-array, or the like. In general, the controller 220 may be any controller or processor device or devices capable of operating an electronic device and implementing the disclosed embodiments.

The apparatus 200 can perform the methods described in all the embodiments. For example, the controller 220 can detect whether a user is touching the side touch sensor 116 on the second side 112 of the user portable wireless communication device 110. The controller 220 can enable the user actuation input 114 of the user input 119 when the controller 220 detects the user is touching the side touch sensor 116 on the second side 112 of the user portable wireless communication device 110. The controller 220 can disable the user actuation input 114 of the user input 119 on the first side 111 of the user portable wireless communication device 110 when the controller 220 detects the user is not touching the side touch sensor 116 on the second side 112 of the user portable wireless communication device 110.

The user actuation input 114 can be a communication initiation input of the user device 110. For example, a communication initiation input can be a call initiation input that dials a phone number, can be a text message send input that sends a text message, can be a push-to-talk button or can be any other user actuation input that initiates communication between the user device 110 and another user wireless communication device. The user actuation input 114 can also be a camera launch/shutter action input, can be an application launch action input, or can be any other user actuation input that actuates a function of a user portable wireless communication device. Accordingly, activation of the user actuation input typically involves a user action including a user using at least a portion of their hand or other body part to touch, press, gesture, or perform any other action to activate the user actuation input. In the case of a call initiation input, the user actuation input 114 can be a dial button and disabling the user actuation input 114 can prevent the dial button from making a call. The controller 220 can disable the communication initiation input when the controller 220 detects the user is not touching the side touch sensor 116. Disabling the user actuation input 114 can include disabling a wireless usage initiation input, such as a call initiation input, a text message send input, and/or a button or icon that initiates a cellular data intensive action, such as downloading a file or starting a video stream, which could otherwise end up costing the user additional money, such as when they were to exceed their data limit.

For example, the controller 220 can disable the user actuation input 114 by preventing, when the controller 220 detects the user is not touching the side touch sensor 116, at least one of placing a phone call, sending a text message, launching a camera application, and/or engaging in outgoing user wireless communication. For example, the controller can halt outgoing user wireless communication by disabling outgoing user wireless communication, such as outgoing calls, outgoing text messages, outgoing e-mail messages, and disabling other outgoing user wireless communication or data intensive operation.

The controller 220 can disable the user actuation input 114 when the controller 220 detects the user is not touching the side touch sensor 116 regardless of whether or not the user device 110 is unlocked. Thus, irrespective of whether the user device 110 can be locked, is locked, or is unlocked, the user actuation input 114 can be disabled. According to this embodiment, even if the user device 110 cannot be locked or does not have a locked mode enabled, the user actuation input 114 can be disabled when the user is not touching the side touch sensor 116. Therefore, disabling the user actuation input 114 can be a separate function from locking the user portable wireless communication device 110. Alternately, disabling the user actuation input 114 can include locking the user portable wireless communication device 110.

The controller 220 can also determine the user portable wireless communication device 110 is stationary and then enable the user actuation input 114 when the user portable wireless communication device 110 is stationary even when the user is not touching the side touch sensor 116. For example, the user device 110 can include an accelerometer, a gyroscope, a compass, positioning determination circuitry, or other components or algorithms that can determine whether the user device 110 is moving or stationary. Then, when the user device 110 is stationary, such as on lying flat on a desktop or propped up by a stand on a stationary surface, the user actuation input 114 can be enabled even if the user is not touching the side touch sensor 116. When the user device 110 is stationary, a user touching the user actuation input 114 may still cause small movements of the user device 110, and the controller 220 can filter out these small movements and still determine the user device 110 is stationary for the purpose of enabling the user actuation input 114 despite no side touch.

According to some embodiments, controller 220 enablement of the user actuation input 113 can be delayed a predetermined time after the controller 220 senses a user is touching the side touch sensor 114. This delay can be in a range from zero seconds to one second or more. For example, the delay can be preset at approximately a half a second or any other useful time period. A user programmable user actuation disablement delay setting can also be used by the user to set the delay to the user's desired delay setting. This delay can prevent unintentional user actuation input 114 activation, such as when the user actuation input 114 is pressed while the user is sliding the device into the user's pocket while still contacting the side touch sensor 116. Thus, when the user lets go of the side touch sensor 116, such as a quarter second later, unintentional user actuation input 114 activation before the user lets go of the side touch sensor 116 can be avoided.

Figure 3:
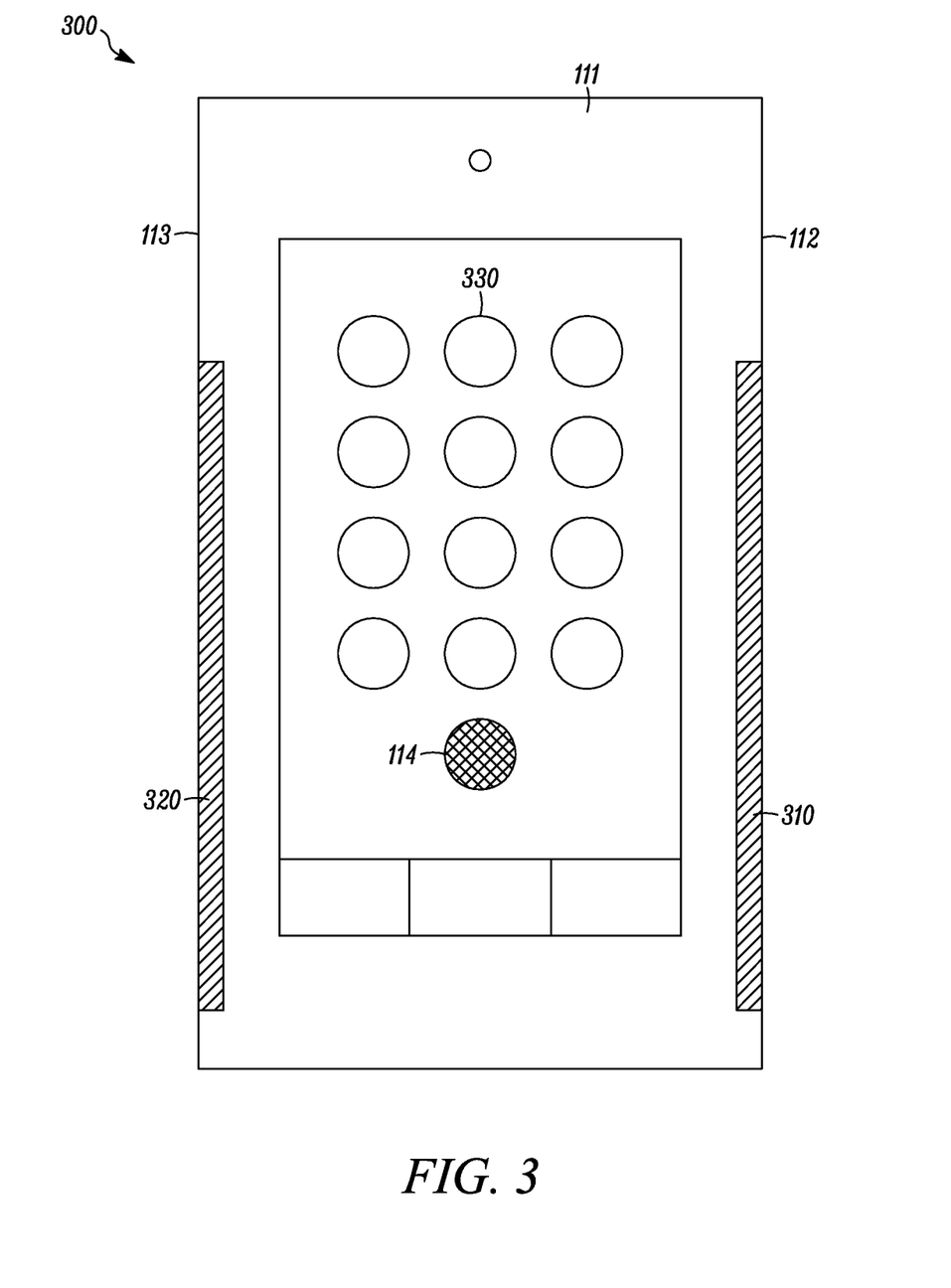
FIG. 3 is an example illustration of an apparatus according to a possible embodiment.

FIG. 3 is an example illustration of an apparatus 300, such as the user device 110, according to a possible embodiment. The apparatus 300 can include all of the elements of the apparatus 200, including elements of the user device 110. The apparatus 300 can also include other inputs 330 on the first side 111. According to this embodiment, the user actuation input 114 can be a communication initiation input icon that has an active appearance when the user actuation input 114 is enabled. The controller 220 can reduce the appearance of the communication initiation input icon when the user is not touching the side touch sensor 116, such as the first side touch sensor 310. For example, reducing the appearance can include making the communication initiation input icon more monochrome, greying out the communication initiation input icon, hiding the communication initiation input icon, making the communication initiation input icon smaller, making the communication input icon translucent/semi transparent, obscuring the communication input icon with a do-not-use symbol, or otherwise reducing the appearance of the communication initiation input icon. This is shown on the apparatus 300 where the other inputs 330 are active with a normal appearance and the user actuation input 114 has a reduced appearance. Thus, the appearance of the communication input icon can be decreased to indicate to a user of the apparatus 300 that the user actuation input 114 is disabled. This also shows how a majority of other user inputs 330 can be active, shown by their lighter appearance, while the user actuation input 114 is disabled. According to a related embodiment, disabling the user actuation input 114 can also include disabling immediate activation of the user actuation input 114, and/or requiring an extended press, such as requiring a press and hold of the user actuation input 114 for a certain period of time to initiate an action.

As indicated above, the side touch sensor 116 can be a first side touch sensor 310. The apparatus 300 can include a third side 113 orthogonal to the first side 111 and on an opposite side of the apparatus 300 from the second side 112 and can include a second side touch sensor 320 on the third side 113. The controller 220 can disable the user actuation input 114 when the user is not touching both the first side touch sensor 310 on the second side 112 of the apparatus 300 and the second side touch sensor 320 on the third side 113 of the apparatus 300. The user actuation input 114 on the first side 111 can also be disabled when the user is not touching either the first side touch sensor 310 or the second side touch sensor 320. Additionally, different device functions can require different levels of sensor engagement. For example, both touch sensors 310 and 320 can be required to be actuated to hit a dial button, but one touch sensor can be required to be actuated to launch an application or camera function. The different levels may be distinguished by unintended communication with another person, such as phone calls, which could require both activated sensors 310 and 320 as compared to unintended nuisances to the user, such as launching an application, which could require only one activated sensor.

Figure 4:
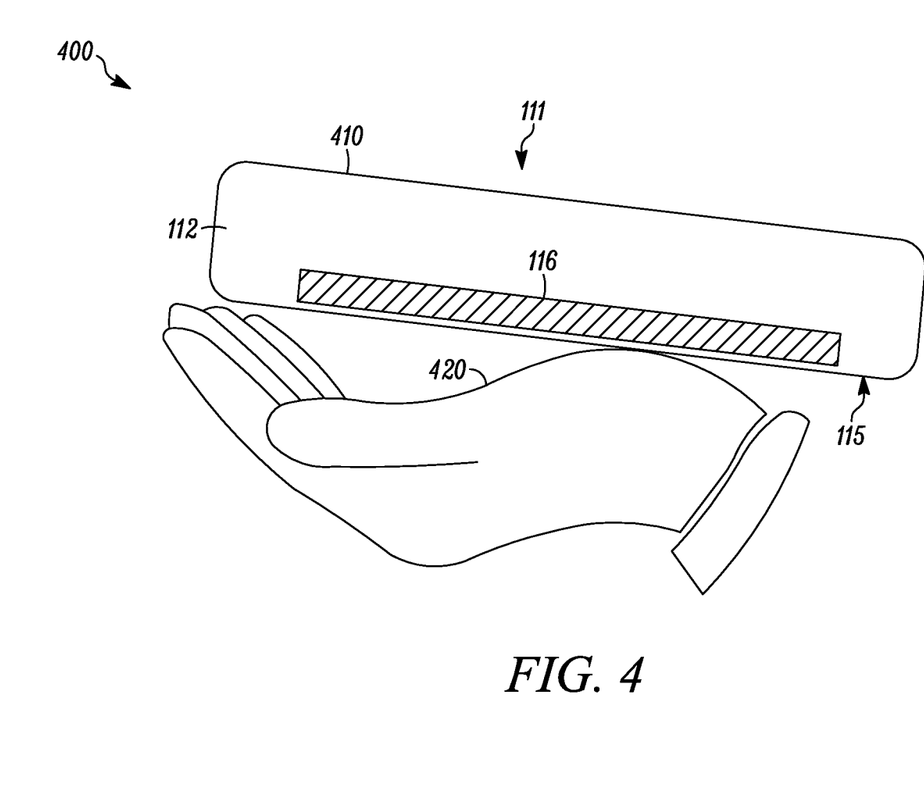
FIG. 4 is an example illustration of an apparatus in a user's hand according to a possible embodiment.

FIG. 4 is an example illustration 400 of an apparatus 410, such as the user device 110, in a user's hand 420 according to a possible embodiment. The apparatus 410 can include a first side 111, a second side 112, a side touch sensor 116, and a third side 115. As shown, the apparatus 410 can have a single side sensor biased toward the bottom of device. According to this embodiment, the third side 115 can be parallel with and opposite from the first side 111 of the apparatus 410 and the side touch sensor 116 can be located on the second side 112 such that it reaches at least a portion of the third side 115 of the apparatus 410. According to different embodiments, the side touch sensor 116 can be located on the second side 112 and can reach at least a portion of a front side or a back side of the apparatus 410. The side touch sensor 116 can even extend around to a portion or all of a front side or a back side of the apparatus 410.

Figure 5:
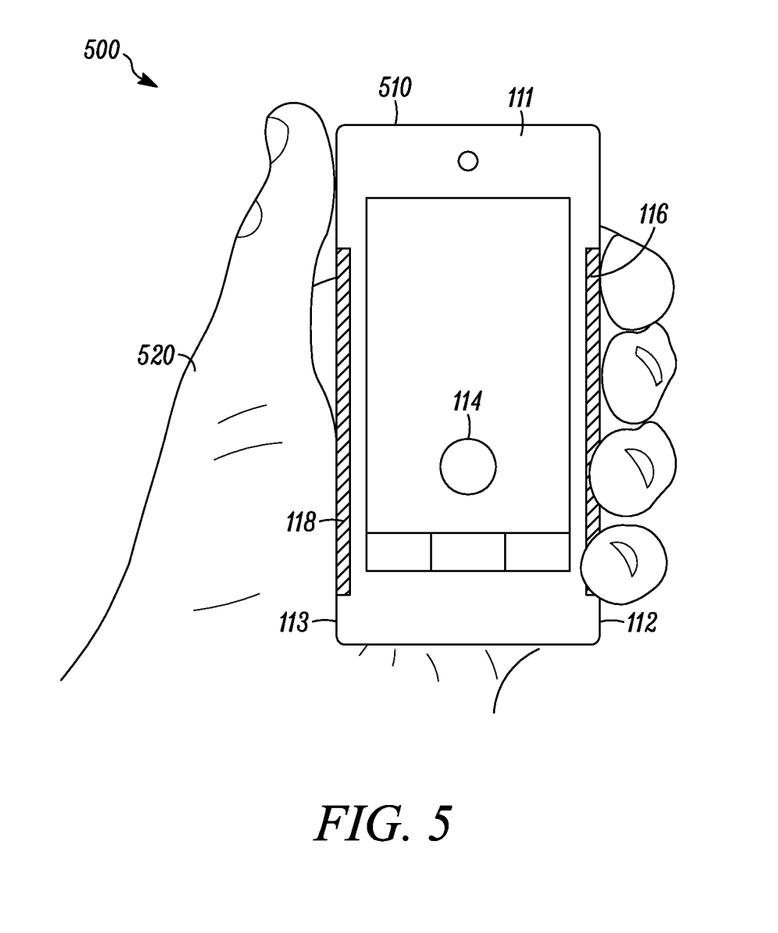
FIG. 5 is an example illustration of an apparatus in a user's hand according to a possible embodiment.

FIG. 5 is an example illustration 500 of an apparatus 510, such as the user device 110, in a user's hand 520 according to a possible embodiment. The apparatus 510 can include the first side 111, the second side 112, the third side 113, the user actuation input 114, the first touch sensor 116, and a second touch sensor 118. As shown, when a user is intentionally using the apparatus 510, the user's hand 520 will touch at least one of the first touch sensor 116 and the second touch sensor 118 when the user actuates the user actuation input 114. Thus, the user actuation input 114 can be enabled when the user is intentionally using the apparatus 510 and activating the user actuation input 114.

Figure 6:
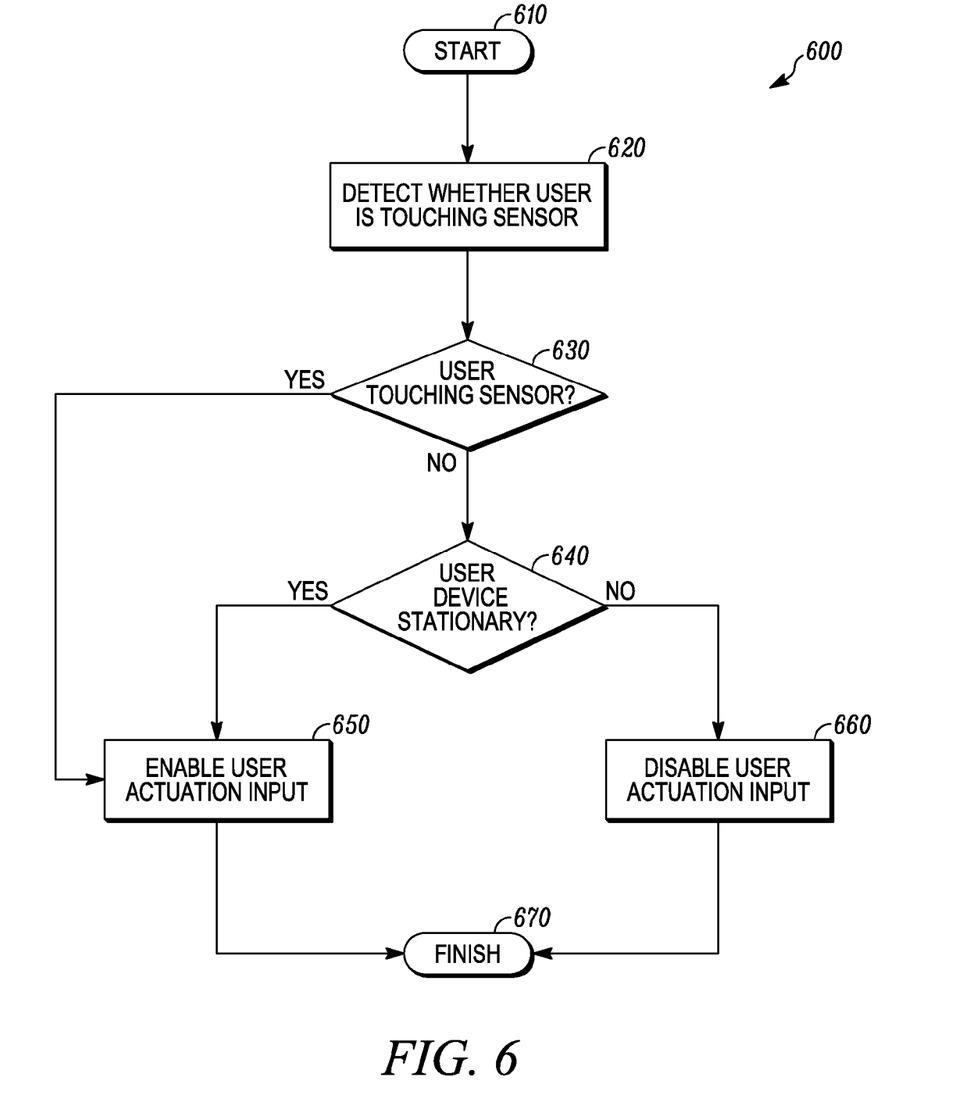
FIG. 6 is an example flowchart illustrating the operation of a user device according to a possible embodiment.

FIG. 6 is an example flowchart 600 illustrating the operation of a user device, such as the user device 110, according to a possible embodiment. At 610, the flowchart 600 can begin. At 620, the user device can detect whether a user is touching at least one side touch sensor on a second side of the user device orthogonal to a first side having a user input. The at least one side touch sensor can include a first side touch sensor and a second side touch sensor on a third side orthogonal to the first side and on an opposite side of the user device from the second side. At 630, the user device can determine whether the user is touching at least one side touch sensor based on the detection. At 640, the user device can determine whether the user device is stationary if the user is not touching at least one side touch sensor.

At 650, when the user is touching at least one side touch sensor and/or when the user device is stationary, a user actuation input of the user input on the first side of the user device can be enabled. The user actuation input can be enabled by default and enabling the user actuation input may just include maintaining the user actuation input in its enabled state. The user actuation input can be enabled when the user portable wireless communication device is stationary even when the user is not touching the side touch sensor on the second side of the user portable wireless communication device. The determination that the user device is stationary of 640 can be made before detection at 620 and the user device can then bypass the detection at 620 and the determination at 630 to enable the user action input at 650 when the user device determines it is stationary. Additionally, as discussed above, enablement of the user actuation input can be delayed a predetermined time, such as canceled within a predetermined time, after sensing a user is touching the side touch sensor. This delay can prevent unintentional user actuation input activation, such as when the user actuation input is pressed while the user is sliding the device into the user's pocket while still contacting the side touch sensor.

At 660, the user actuation input of the user input on the first side of the user portable wireless communication device can be disabled when the user is not touching the side touch sensor on the second side of the user portable wireless communication device and/or the user device is not stationary. The user actuation input can be disabled when the user is not touching the side touch sensor regardless of whether or not the user portable wireless communication device is unlocked. The user actuation input can be a communication initiation input and disabling the user actuation input can include disabling the communication initiation input when the user is not touching the side touch sensor. For example, disabling the user actuation input can include preventing, when the user is not touching the side touch sensor, disabling placing a phone call, disabling sending a text message, disabling launching a camera application, disabling outgoing user wireless communication and/or disabling any other operation that is performed in response to a user activating a user actuation input. The communication initiation input can include a communication initiation input icon that has an active appearance when the communication initiation input is enabled and disabling the user actuation input can include reducing the appearance of the communication initiation input icon when the user is not touching the side touch sensor. Disabling the user actuation input can also include disabling the user actuation input when the user is not touching both a first side touch sensor on the second side of the user device and the second side touch sensor on the third side of the user device. At 670, the flowchart 600 can end.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. Also, some of the steps performed can be repeated on an ongoing or continuous basis simultaneously while other steps are performed. Furthermore, different steps can be performed by different elements or in a single element of the disclosed embodiments.

Some embodiments can provide for a method and apparatus is proposed to prevent unintentional triggers, such as pressing "send," following phone dial and/or text message, triggering a shutter release following camera launch, and/or launching an application, following unintended touch screen grip, and/or following other actions that may not be intentionally made. A user device can have at least one side touch sensor, such as one sensor, such as two sensors on both sides of the device, or such as any other number of sensors on different locations on the device. Typically, when dialing a number, user first enters the numbers then presses "send" or other corresponding communication initiation input to make the call. If the device is carried by the user and the device non-stationary, such as not on a table as determined via movement circuitry, the "send" command can appear on the screen as selectable as long as the detection is made of a user grip or touch at the sensor on the device side or sides. Otherwise, the entered number can sit as-is and may not be dialed while the "send" actuation button or icon non-selectable and/or grayed out. For example, when the user slips the phone into a pocket or a purse, the user lets go of the sides and the side touch sensor is no longer triggered. Thus, the action of sliding phone into a pocket or of the phone bouncing against objects in a purse does not cause a misdial. The same result can happen with text messaging or email operations. According to some embodiments, when user grabs the user device front-to-back, such as when touching a touch screen and a back side instead of grabbing the device by its edges or sides, input on a touch screen display can be made inactive to prevent inadvertent inputs. If the device is in the user's hand or on the user's person, such as determined via an accelerometer, the user can be required to grab the device from its sides to operate it correctly. For a case of the user placing the device flat on their hand where the user's hand is not gripping the phone edges, the same side touch sensor can be designed to trigger in that situation by placing it close enough to an underside of the device opposite from a user actuation input to detect the user is holding the device in the user's hand. According to some embodiments, when the device is placed stationary on a surface such as on a desk top, user actuation inputs, such a "send" button, a camera release, and/or application activation icons, can all be selectable and the lack of a side touch may not disable them.

The method of this disclosure can be implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of" followed by a list is defined to mean one, some, or all, but not necessarily all of, the elements in the list. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

We claim:

1. A user portable wireless communication device comprising:
    a first side;
    a user input located on the first side, the user input including a user actuation input;
    a second side orthogonal to the first side;
    a side touch sensor on the second side; and
    a controller coupled to the user input and the side touch sensor, the controller configured to detect whether a user is touching the side touch sensor on the second side of the user portable wireless communication device, configured to enable the user actuation input of the user input on the first side of the user portable wireless communication device when the controller detects the user is touching the side touch sensor on the second side of the user portable wireless communication device, and configured to disable the user actuation input of the user input on the first side of the user portable wireless communication device when the controller detects the user is not touching the side touch sensor on the second side of the user portable wireless communication device.

2. The user portable wireless communication device according to claim 1,
    wherein the user actuation input comprises a communication initiation input of the user portable wireless communication device, and
    wherein the controller is configured to disable the communication initiation input when the side touch sensor detects the user is not touching the side touch sensor.

3. The user portable wireless communication device according to claim 2,
    wherein the communication initiation input comprises a communication initiation input icon that has an active appearance when the communication initiation input is enabled, and
    wherein the controller is configured reduce the appearance of the communication initiation input icon when the side touch sensor detects the user is not touching the side touch sensor.

4. The user portable wireless communication device according to claim 1,
    wherein the user portable wireless communication device comprises a third side parallel with and opposite from the first side of the user portable wireless communication device, and
    wherein the side touch sensor is located on the second side such that it reaches at least a portion of the third side of the user portable wireless communication device.

5. The user portable wireless communication device according to claim 1, wherein the side touch sensor comprises at least one of a capacitive side touch sensor on the second side of the user portable wireless communication device and a heat sensor on the second side of the user portable wireless communication device.

6. The user portable wireless communication device according to claim 1, wherein the controller is configured to disable the user actuation input of the user input on the first side of the user portable wireless communication device when the controller detects the user is not touching the side touch sensor on the second side of the user portable wireless communication device regardless of whether or not the user portable wireless communication device is unlocked.

7. The user portable wireless communication device according to claim 1, wherein the controller is configured to disable the user actuation input by preventing, when the side touch sensor detects the user is not touching the side touch sensor on the second side of the user portable wireless communication device, at least one of placing a phone call, sending a text message, launching a camera application, and engaging in outgoing user wireless communication.

8. The user portable wireless communication device according to claim 1,
    wherein the controller is configured to determine the user portable wireless communication device is stationary, and
    wherein the controller is configured to enable a user actuation input of the user input on the first side of the user portable wireless communication device when the user portable wireless communication device is stationary even when the side touch sensor detects the user is not touching the side touch sensor on the second side of the user portable wireless communication device.

9. The user portable wireless communication device according to claim 1,
    wherein the side touch sensor comprises a first side touch sensor,
    wherein the user portable wireless communication device comprises a third side orthogonal to the first side and on an opposite side of the user portable wireless communication device from the second side and includes a second side touch sensor on the third side, and
    wherein the controller is configured to disable the user actuation input of the user input on the first side of the user portable wireless communication device when the user is not touching both the first side touch sensor on the second side of the user portable wireless communication device and the second side touch sensor on the third side of the user portable wireless communication device.

10. A method in a user portable wireless communication device including a first side, a second side orthogonal to the first side, a user input on the first side, and a side touch sensor on the second side, the method comprising:
    detecting whether a user is touching the side touch sensor on the second side of the user portable wireless communication device;
    enabling a user actuation input of the user input on the first side of the user portable wireless communication device when the user is touching the side touch sensor on the second side of the user portable wireless communication device; and disabling the user actuation input of the user input on the first side of the user portable wireless communication device when the user is not touching the side touch sensor on the second side of the user portable wireless communication device.

11. The method according to claim 10, wherein the user actuation input comprises a communication initiation input, and wherein disabling the user actuation input comprises disabling the communication initiation input of the user portable wireless communication device when the side touch sensor detects the user is not touching the side touch sensor.

12. The method according to claim 11, wherein the communication initiation input comprises a communication initiation input icon that has an active appearance when the communication initiation input is enabled, and wherein disabling the user actuation input comprises reducing the appearance of the communication initiation input icon when the user is not touching the side touch sensor.

13. The method according to claim 10, wherein the user portable wireless communication device comprises a third side parallel with and opposite from the first side of the user portable wireless communication device, and wherein the side touch sensor is located on the second side such that it reaches at least a portion of the third side of the user portable wireless communication device.

14. The method according to claim 10, wherein the side touch sensor comprises at least one of a capacitive side touch sensor on the second side of the user portable wireless communication device and a heat sensor on the second side of the user portable wireless communication device.

15. The method according to claim 10, wherein disabling the user actuation input comprises disabling the user actuation input of the user input on the first side of the user portable wireless communication device when the user is not touching the side touch sensor on the second side of the user portable wireless communication device regardless of whether or not the user portable wireless communication device is unlocked.

16. The method according to claim 10, wherein disabling the user actuation input of the user input on the first side of the user portable wireless communication device comprises preventing, when the user is not touching the side touch sensor on the second side of the user portable wireless communication device, at least one of placing a phone call, sending a text message, launching a camera application, and engaging in outgoing user wireless communication.

17. The method according to claim 10, further comprising:

determining the user portable wireless communication device is stationary; and enabling a user actuation input of the user input on the first side of the user portable wireless communication device when the user portable wireless communication device is stationary even when the user is not touching the side touch sensor on the second side of the user portable wireless communication device.

18. The method according to claim 10, wherein the side touch sensor comprises a first side touch sensor, wherein the user portable wireless communication device includes a third side orthogonal to the first side and on an opposite side of the user portable wireless communication device from the second side and includes a second side touch sensor on the third side, and wherein disabling the user actuation input comprises disabling the user actuation input of the user input on the first side of the user portable wireless communication device when the user is not touching both the first side touch sensor on the second side of the user portable wireless communication device and the second side touch sensor on the third side of the user portable wireless communication device.

19. A user portable wireless communication device comprising:

a first side;

a user input located on the first side, the user input including a wireless usage initiation input;

a second side orthogonal to the first side;

a side touch sensor on the second side; and a controller coupled to the user input and the side touch sensor, the controller configured to detect whether a user is touching the side touch sensor on the second side of the user portable wireless communication device, configured to enable the wireless usage initiation input when the controller detects the user is touching the side touch sensor, and configured to disable the wireless usage initiation input when the controller detects the user is not touching the side touch sensor regardless of whether or not the user portable wireless communication device is unlocked.

20. The user portable wireless communication device according to claim 19, wherein the controller is configured to determine the user portable wireless communication device is stationary, and wherein the controller is configured to enable the wireless usage initiation input when the user portable wireless communication device is stationary even when the user is not touching the side touch sensor.

* * * * *